(12) United States Patent
Chen et al.

(10) Patent No.: US 11,827,974 B2
(45) Date of Patent: Nov. 28, 2023

(54) SPUTTERING SYSTEM

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Po-Lun Chen, Shenzhen (CN); Chun-Ta Chen, Shenzhen (CN); Tsung-Chen Chou, Shenzhen (CN); Chin-Yang Wu, Shenzhen (CN); Nai-Hau Shiue, Shenzhen (CN)

(73) Assignees: Interface Technology (Chengdu) Co., Ltd., Chengdu (CN); Interface Optoelectronics (Shenzhen) Co., Ltd., Guangdong (CN); General Interface Solution Limited, Miaoli County (TW)

( * ) Notice: Subject to any disclaimer, the term of this patent is extended or adjusted under 35 U.S.C. 154(b) by 239 days.

(21) Appl. No.: 17/117,396

(22) Filed: Dec. 10, 2020

(65) Prior Publication Data
US 2022/0127715 A1    Apr. 28, 2022

(30) Foreign Application Priority Data
Oct. 23, 2020    (CN) .......................... 202011148944.5

(51) Int. Cl.
*C23C 14/54*    (2006.01)
*C23C 14/04*    (2006.01)
*C23C 14/34*    (2006.01)

(52) U.S. Cl.
CPC ............ *C23C 14/54* (2013.01); *C23C 14/042* (2013.01); *C23C 14/3464* (2013.01)

(58) Field of Classification Search
CPC ... C23C 14/54; C23C 14/042; C23C 14/3464; C23C 14/352; C23C 14/56;
(Continued)

(56) References Cited

U.S. PATENT DOCUMENTS

| 2007/0224350 | A1* | 9/2007 | Schuisky ............... C23C 14/225 156/345.31 |
| 2009/0266704 | A1* | 10/2009 | Hori ...................... C23C 14/086 204/192.15 |
| 2019/0003039 | A1* | 1/2019 | Portka ............... H01J 37/32541 |

FOREIGN PATENT DOCUMENTS

| CN | 211445884 U | * | 9/2020 |
| JP | 2004084022 A | * | 3/2004 |

OTHER PUBLICATIONS

CN-211445884-U Translation (Year: 2020).*
JP-2004084022-A Translation (Year: 2004).*

* cited by examiner

*Primary Examiner* — Jennifer Wecker
*Assistant Examiner* — Patrick S Ott
(74) *Attorney, Agent, or Firm* — Rosenberg, Klein & Lee

(57) ABSTRACT

A sputtering system is suitable for sputtering a surface to be sputtered having sections. Each section has a projection height. The sputtering system includes a supporting plate, a sputtering array, and a controller. The sputtering array is arranged on the supporting plate. The sputtering array includes sputtering units. Each section corresponds to at least one of the sputtering units. Each sputtering unit has a driving shaft and a target. The target faces the surface to be sputtered. The controller is electrically connected the driving shaft. The driving shaft drives the target to move relative to the surface to be sputtered. The controller controls a distance between each sputtering unit and the corresponding (Continued)

section of the sections in the direction of the projection height to satisfy a given condition.

11 Claims, 14 Drawing Sheets

(58) Field of Classification Search
CPC .. C23C 14/568; C23C 14/562; H01J 37/3417;
H01J 37/3435; H01J 37/3473
USPC .................................................. 204/298.23
See application file for complete search history.

SPUTTERING SYSTEM

BACKGROUND OF THE INVENTION

This application claims priority of Application No. 202011148944.5 filed in China on 23 Oct. 2020 under 35 U.S.C. § 119; the entire contents of all of which are hereby incorporated by reference.

FIELD OF THE INVENTION

The present invention relates to a sputtering system, particularly to a sputtering system suitable for sputtering an object with a curved surface or a three-dimensional surface.

DESCRIPTION OF THE RELATED ART

Nowadays, the sputtering technology has already been applied to semiconductor industry and optoelectronic industry. When the surface of an object is planar, the distances of all targets to the surface of the object are equal. Thus, the sputtered film easily has a uniform thickness. When the surface of an object is curved, the distances of all targets to the surface of the object may be unequal. Thus, the rates for sputtering the surface of the object are unequal, such that the sputtered film has a non-uniform thickness. In order to solve the problem with the non-uniform thickness of the sputtered film, the conventional technology additionally installs a mask to change the thickness of the sputtered film. However, although the additionally-installed mask can improve the uniformity of the sputtered film on the curved surface, the overall sputtering rate is greatly reduced.

To overcome the abovementioned problems, the present invention provides a sputtering system suitable for sputtering an object with a curved surface, so as to improve the sputtering uniformity and solve the afore-mentioned problems of the prior art.

SUMMARY OF THE INVENTION

The present invention provides a sputtering system, which independently controls each sputtering unit to uniformly sputter a non-uniform three-dimensional surface.

In an embodiment of the present invention, a sputtering system is configured to sputter a surface to be sputtered. Each of the sections has a projection height. The sputtering system includes a supporting plate, a sputtering array, and a controller. The sputtering array is arranged on the supporting plate. The sputtering array includes sputtering units. Each of the sections corresponds to at least one of the sputtering units. Each of the sputtering units has a driving shaft and a target. The first end of the driving shaft is connected to the supporting plate. The second end of the driving shaft is connected to the target. The target faces the surface to be sputtered. The controller is electrically connected to the driving shaft. The driving shaft is configured to drive the target to move relative to the surface to be sputtered. The controller is configured to control a distance between each of the sputtering units and a corresponding section of the sections in the direction of the projection height to satisfy a given condition.

In an embodiment of the present invention, the sputtering system further includes at least one chamber and a supporting device. The at least one chamber accommodates the supporting plate, the sputtering array, and the controller. The supporting device supports an object having the surface to be sputtered. The supporting device horizontally moves in and out of the at least one chamber and drives the object having the surface to be sputtered to move. The sputtering array is configured to sputter the surface to be sputtered that is driven by the supporting device to move.

In an embodiment of the present invention, the sputtering system further includes at least one chamber and a supporting device. The at least one chamber accommodates the supporting plate, the sputtering array, and the controller and surrounds the supporting device. The supporting device supports an object having the surface to be sputtered. The supporting device drives the object having the surface to be sputtered to rotate. The sputtering array is configured to sputter the surface to be sputtered that is driven by the supporting device to rotate.

In an embodiment of the present invention, the sputtering array is an array with N columns and M rows, M is a positive integer larger than or equal to 2, and N is a natural number.

In an embodiment of the present invention, the targets of the sputtering units have equal lengths and the direction of the length is perpendicular to the direction of the projection height.

In an embodiment of the present invention, the targets of the sputtering units have unequal lengths and the direction of the length is perpendicular to the direction of the projection height.

In an embodiment of the present invention, the sections are respectively curved surfaces, the target of each of the sputtering units has a length, and the length depends on the curvature of the corresponding curved surface of the curved surfaces.

In an embodiment of the present invention, the sections are respectively curved surfaces, the sputtering surfaces of the sputtering units have unequal elevation angles relative to the direction of the projection height, and the elevation angle of one of the sputtering units depends on the tangent direction of the corresponding curved surface of the curved surfaces or a connecting line between two end points of the corresponding curved surface.

In an embodiment of the present invention, each column of the sputtering units has the targets made of the same material and every two adjacent columns of the sputtering units have the targets made of different materials.

In an embodiment of the present invention, the target of each of the sputtering units has a shape of a pillar and the sputtering units are arranged and extended in a horizontal direction parallel to the supporting plate.

In an embodiment of the present invention, the target of each of the sputtering units has a shape of a pillar and the sputtering units are arranged and extended in a direction perpendicular to the supporting plate.

In an embodiment of the present invention, the sputtering units are pillar-shaped sputtering units, the target of each of the sputtering units has a shape of a pillar, and all columns of the sputtering units are staggered from each other in a horizontal direction parallel to the supporting plate.

In an embodiment of the present invention, the target of each of the sputtering units has a planar shape and all columns of the sputtering units are aligned to each other in a horizontal direction parallel to the supporting plate.

In an embodiment of the present invention, the target of each of the sputtering units has a planar shape and all columns of the sputtering units are staggered from each other in a horizontal direction parallel to the supporting plate.

In an embodiment of the present invention, each of the sputtering units includes a mask arranged between the target of each of the sputtering units and the corresponding section of the sections.

In an embodiment of the present invention, the mask includes movable sub-masks and the sputtering rate of the sputtering array depends on the horizontal movement of the sub-masks.

In an embodiment of the present invention, the mask includes openings and the sputtering rate of the sputtering array depends on the sizes of the openings.

DETAILED DESCRIPTION OF THE INVENTION

Figure 1:
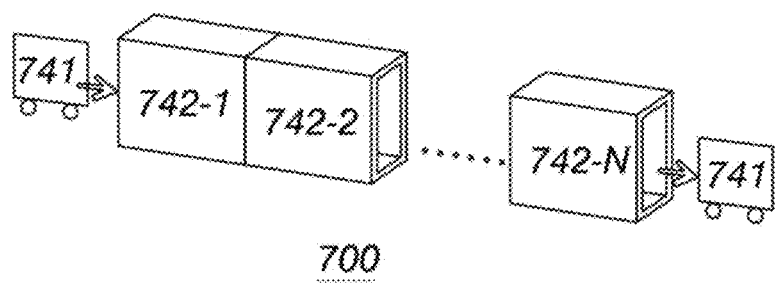
FIG. 1 is a diagram schematically illustrating a sputtering system according to an embodiment of the invention.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the present invention will be discussed to guide practitioners about the present invention. Every example in the present specification cannot limit the claimed scope of the present invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range. For example, if it is described that the length of a component is X cm to Y cm, then it is equivalent to sentence "the length of the component is H, and H can be any real number values between the values of X and Y."

Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Furthermore, it can be understood that the terms "comprising," "including," "having," "containing," and "involving" are open-ended terms, which refer to "may include but is not limited to so." Besides, each of the embodiments or claims of the present invention is not necessary to achieve all the effects and advantages possibly to be generated, and the abstract and title of the present invention is used to assist for patent search and is not used to further limit the claimed scope of the present invention.

Referring to FIG. 1, FIG. 1 is a diagram schematically illustrating a sputtering system 700 according to an embodiment of the invention. The sputtering system 700 independently controls each sputtering unit to uniformly sputter a non-uniform three-dimensional surface (i.e., a surface to be sputtered) or a planar surface, but the present invention is not limited thereto. The sputtering system 700 may include one or more chambers. For example, FIG. 1 illustrates chambers 742-1~742-N. The sputtering system 700 utilizes an in-line type process. A trolley 741 loads an object to be sputtered and moves through the chambers, such that a sputtered process is performed on the object. Although the embodiment uses the trolley 741 as the transmission architecture of the sputtering system 700 for transmitting the object to be sputtered, the trolley is replaced with other transmission mechanisms in other embodiments.

Figure 2:
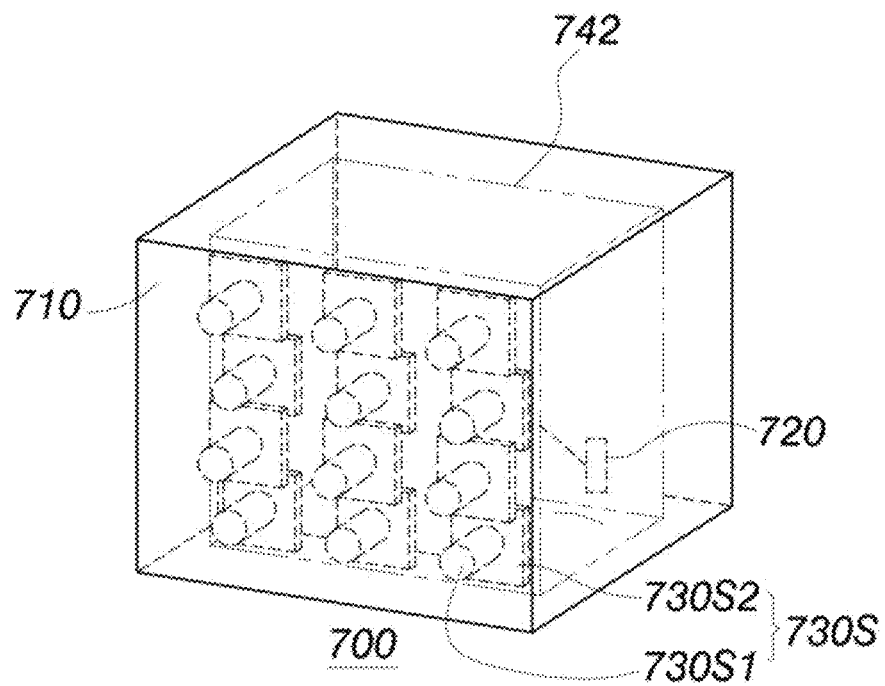
FIG. 2 is a diagram schematically illustrating a chamber and a supporting plate therein of FIG. 1.

Referring to FIG. 1 and FIG. 2, FIG. 2 is a diagram schematically illustrating one of chambers 742-1~742-N of FIG. 1. A chamber 742 is one of the chambers 742-1~742-N. The chamber 742 accommodates a supporting plate 710, a controller 720, and a sputtering array. The supporting 710 may be implemented with the inner wall of the chamber 742 or a plate on the inner wall of the chamber 742. The sputtering array includes sputtering units 730S. A side of the sputtering unit 730S connects to the supporting plate 710 and another side of the sputtering unit 730S faces a path where the object to be sputtered moves to sputter the object. In detail, each sputtering unit 730S has a driving shaft 730S 1 and a target 730S2. The first end of the driving shaft 730S1 is connected to the supporting plate 710, and the second end of the driving shaft 730S1 is connected to the target 730S2.

Figure 3:
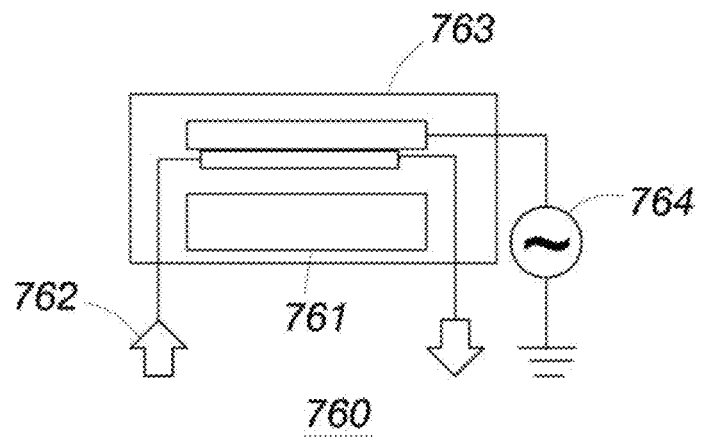
FIG. 3 is a diagram schematically illustrating the internal structure of a sputtering unit according to an embodiment of the invention.
Figure 4:
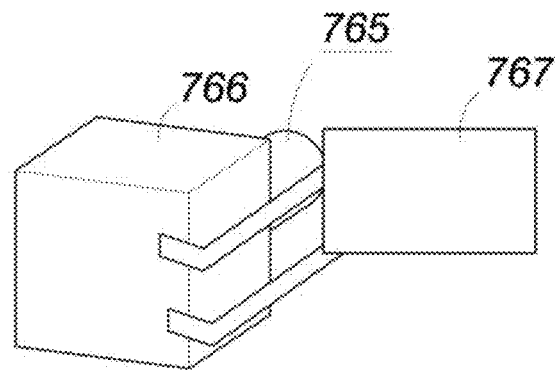
FIG. 4 is a diagram schematically illustrating a sputtering unit connected to a gas controlling unit according to an embodiment of the present invention.
Figure 5:
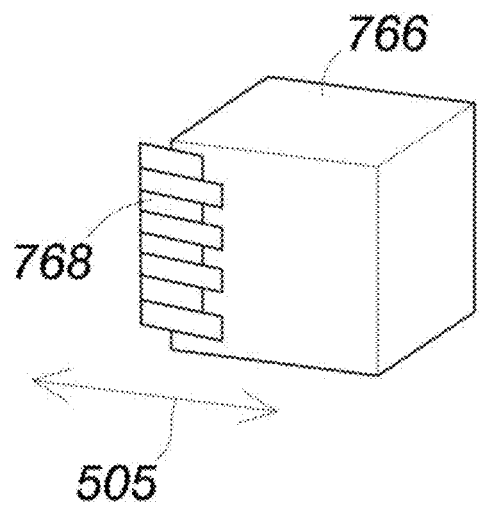
FIG. 5 is a diagram schematically illustrating the target and the mask of a sputtering unit according to an embodiment of the invention.

For example, each sputtering unit 730S of the sputtering array 730 is independently controlled. Each sputtering unit 730S may include a target, a movement controlling unit, a gas controlling unit, a mask, a cooled water path, and an electrode layer, as illustrated in FIGS. 3~5. FIG. 3 is a diagram schematically illustrating the internal structure 760 of the sputtering unit 730S according to an embodiment of the invention. The internal structure 760 includes a magnetic body 761, a cooled water path 762, and an electrode layer 763. The electrode layer 763 is coupled to a power 764. The structure of the target and how to use the target can be understood by those skilled in the art so will not be reiterated. FIG. 4 is a diagram schematically illustrating the sputtering unit 730S connected to a gas controlling unit 767 according to an embodiment of the present invention. The controller 720 (as illustrated in FIG. 2) may control the movement of a driving shaft 765 and either drive a target 766 to move towards or away from the surface of the object to be sputtered or drive the target surface of the target 766 to rotate and have an elevation angle relative to the surface of the object to be sputtered. The target 766 is coupled to a gas controlling unit 767. The gas controlling unit 767 may be a mass flow controller (MFC). FIG. 5 is a diagram schematically illustrating the target 766 and the sub-masks 768 of the sputtering unit 730S according to an embodiment of the invention. As illustrated in FIG. 5, the sub-masks 768 horizontally moves in the direction of an arrow 505 and the sputtering rate of the sputtering unit 730S may depend on the horizontal movement of the sub-masks 768. The sub-masks 768 may respectively move. Alternatively, all of the sub-masks 768 move together. The way of moving the sub-masks 768 is adaptable according to requirement. The larger the area where the sub-masks 768 shield the target 766, the lower the sputtering rate. Besides, the sputtering rate of each sputtering unit is influenced by target power, ventilation, and the moving speed of the object to be sputtered.

The sputtering array 730 is electrically connected to the controller 720. The controller 720 respectively controls the distance of each sputtering unit 730S to the corresponding section of the three-dimensional surface to satisfy a given condition based on the variation of the curvature of the three-dimensional surface of the object to be sputtered. The variation of the curvature of the three-dimensional surface depends on the highest point and the lowest point of a curved surface. In the embodiment, each section of the three-dimensional surface may be a curved surface. Thus, the distance of the sputtering unit 730S to the corresponding section of the three-dimensional surface may be an average value of distances of the sputtering unit 730S to all points of the curved surface, a distance of the sputtering unit 730S to the highest point of the curved surface, or a distance of the sputtering unit 730S to the lowest point of the curved surface, but the present invention is not limited thereto.

According to an embodiment of the present invention, the given condition defines that a distance between each sputtering unit 730S and the corresponding section of the three-dimensional surface is substantially equal. The terms "substantially equal" can refer to the meaning of the phrases of "exactly equal" or "within few errors of a value or a range". For example, the distances of different targets to the object to be sputtered have an error of 0~10 cm. Each sputtering unit of the sputtering array is independently controlled to have a distance to the three-dimensional surface, wherein the distance having an error within a specific range is included within the scope of the present invention.

Figure 6A:
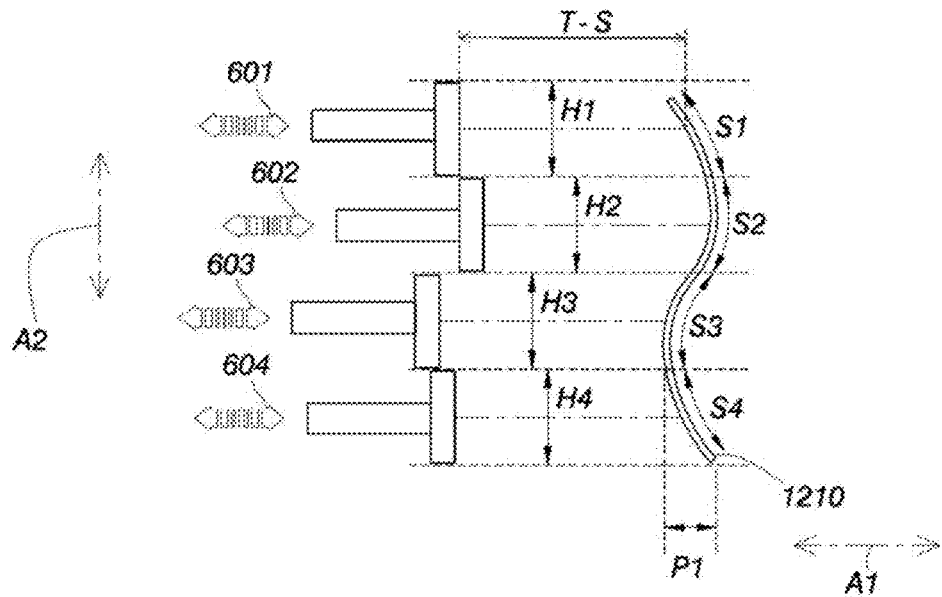
FIG. 6A is a diagram schematically illustrating a relative relation between a planar target and a three-dimensional surface according to an embodiment of the present invention.
Figure 6B:
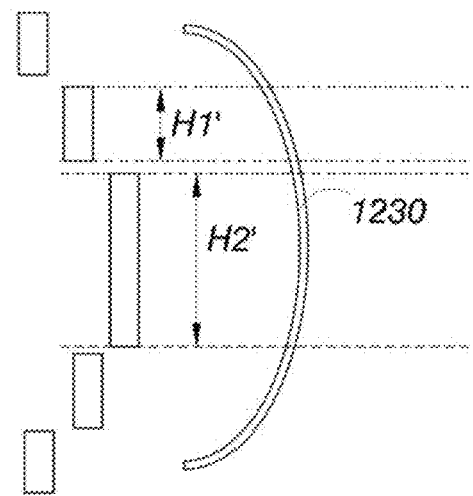
FIG. 6B is a diagram schematically illustrating a relative relation between a planar target and a three-dimensional surface according to another embodiment of the present invention.

Referring to FIG. 6A, FIG. 6A is a diagram schematically illustrating a relative relation between a planar target and a three-dimensional surface according to an embodiment of the present invention. As illustrated in FIG. 6A, a three-dimensional surface 1230 is divided into four curved sections S1~S4 (or more sections). Each of the curved sections S1~S4 has a projection height. For example, the curved section S4 has a projection height P1. It is noted that the projection height P1 may be the height of the highest point of the curved section S4 or the average height of all points of the curved section S4 in order to describe the three-dimensional variation of each curved section. That is to say, when the three-dimensional surface 1230 of the object to be sputtered is replaced with a planar surface (not illustrated), the projection height of each planar section is equal. Then, the lengths H1~H4 of the corresponding planar targets are determined based on the curved sections S1~S4. In other words, the length of the planar target depends on the curvature of the corresponding curved section. If the overall curvature of the three-dimensional surface 1230 slightly varies, the curved sections have similar curvatures. Thus, planar targets having equal lengths can be used. Specifically, the lengths H1~H4 are equal. For example, the length of the target may has a range of 1~50 cm, preferably 10~15 cm. In the embodiment, the direction A1 of the projection height P1 is perpendicular to the direction A2 of the lengths H1~H4 of the targets, but the present invention is not limited thereto. FIG. 6B is a diagram schematically illustrating a relative relation between a planar target and a three-dimensional surface according to another embodiment of the present invention. If the overall curvature of the three-dimensional surface 1230 greatly varies, the curvatures of the curved sections greatly vary. Thus, planar targets having unequal lengths can be used. Specifically, the lengths H1' and H2' of two targets are unequal or equal. In general, the more the number of the curved sections, the higher the sputtering uniformity. Besides, the driving shafts respectively drive the targets to move towards or away from the curved sections S1~S4 along moving directions 601~604.

Figure 7A:
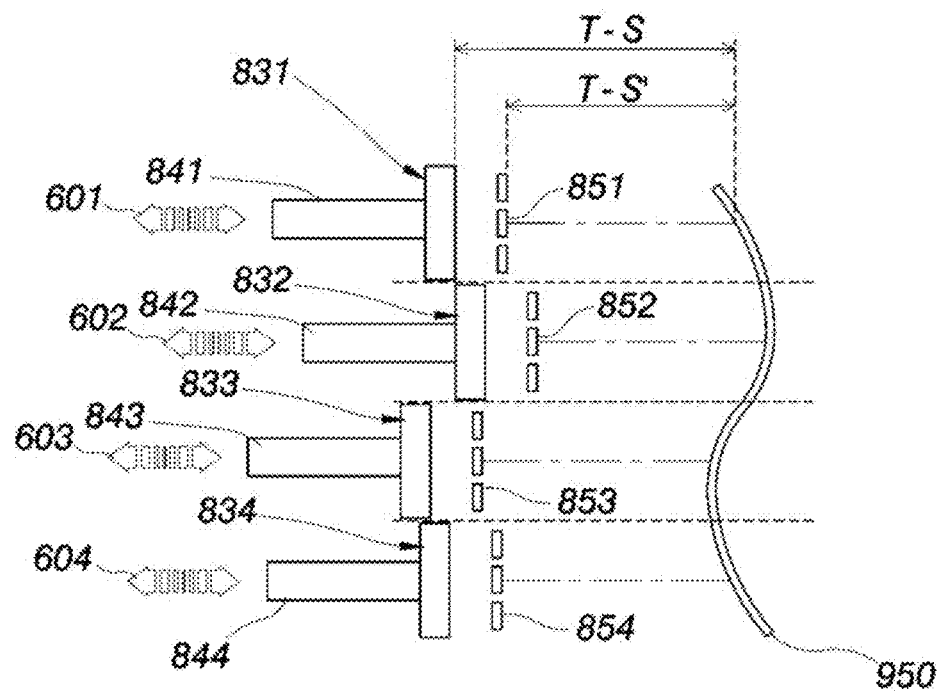
FIG. 7A is a side view of independently controlling the distances of targets to a three-dimensional surface of the present invention.
Figure 7B:
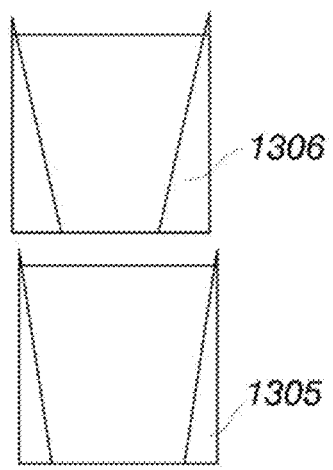
FIG. 7B is a diagram schematically illustrating the target and the mask with an adjusted opening of a sputtering unit according to an embodiment of the present invention.
Figure 8:
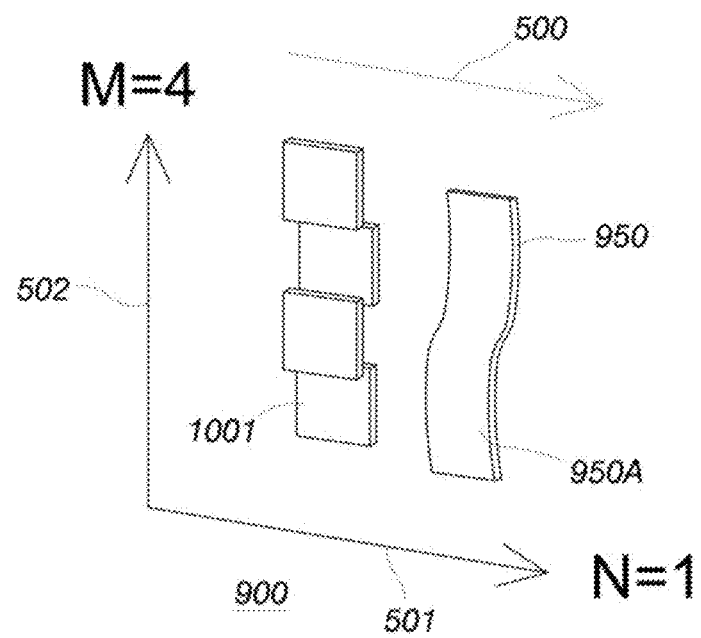
FIG. 8 is a diagram schematically illustrating sputtering units divided into sections according to an embodiment of the present invention.

Referring to FIG. 7A, FIG. 7A is a side view of independently controlling the distances of targets to a three-dimensional surface of the present invention. Assume that masks 851~854 are not used. The distances of targets 831~834 to an object 950 to be sputtered are independently controlled, such that the targets 831~834 horizontally move towards or away from the object 950 to be sputtered along directions 601~604. Thus, the equal or similar distances T-S (viewed as the given condition) of the targets 831~834 to an object 950 to be sputtered is maintained. The targets 831~834 respectively correspond to driving shafts 841~844. In another embodiment, the present invention may arrange masks 851~854 between the targets 831~834 and a three-dimensional surface 840. The masks 851~854 are arranged between the targets 831~834 and the object 950 to be sputtered. The distances of the masks 851~854 to the object 950 to be sputtered are fixed to T-S'. In a variation of the embodiment, the distance T-S (or T-S') may be 6~20 cm, preferably 8~12 cm. In the embodiment, a distance between each sputtering unit and the surface of the object to be sputtered is adjusted to be approximate to T-S as much as possible. If the distance between each sputtering unit and the surface of the object to be sputtered has a little error, the sizes of the openings (i.e., gaps among the masks 851~854) of the masks 851~854 are adjusted to change the sputtering rate. When the target moves towards the object to be sputtered, the sputtering rate is high. When the target moves away from the object to be sputtered, the sputtering rate is low. FIG. 7B respectively illustrates a mask 1305 with a raised opening and a mask 1306 with a lowered opening. The mask 1305 has a higher opening rate, such that the sputtering rate of the target is higher. The mask 1306 has a lower opening rate, such that the sputtering rate of the target is lower.

Figure 9:
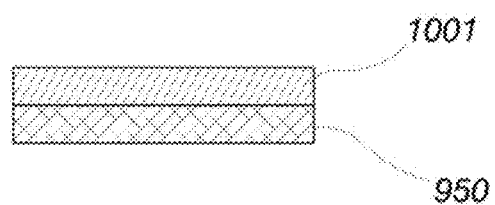
FIG. 9 is a diagram schematically illustrating a sputtered surface to be sputtered that corresponds to FIG. 8.

Referring to FIGS. 8~13, FIG. 8 is a diagram schematically illustrating sputtering units divided into sections according to an embodiment of the present invention. The object 950 to be sputtered moves relative to the sputtering units along a moving direction 500 (e.g., the direction where the trolley 741 horizontal moves in FIG. 1), thereby sputtering an object 950A to be sputtered. The sputtering array may be an array with N columns and M rows, M is a positive integer larger than or equal to 2, and N is a natural number. In an example of FIG. 8, a sputtering array 900 is a sputtering array with one column and four rows (i.e., N=1 and M=4). The architecture is used to stack a single sputtering material (e.g., SiO$_2$) on an object 950 to be sputtered, as illustrated in FIG. 9. FIG. 9 is a diagram schematically illustrating a sputtered surface to be sputtered that corresponds to FIG. 8.

Figure 10:
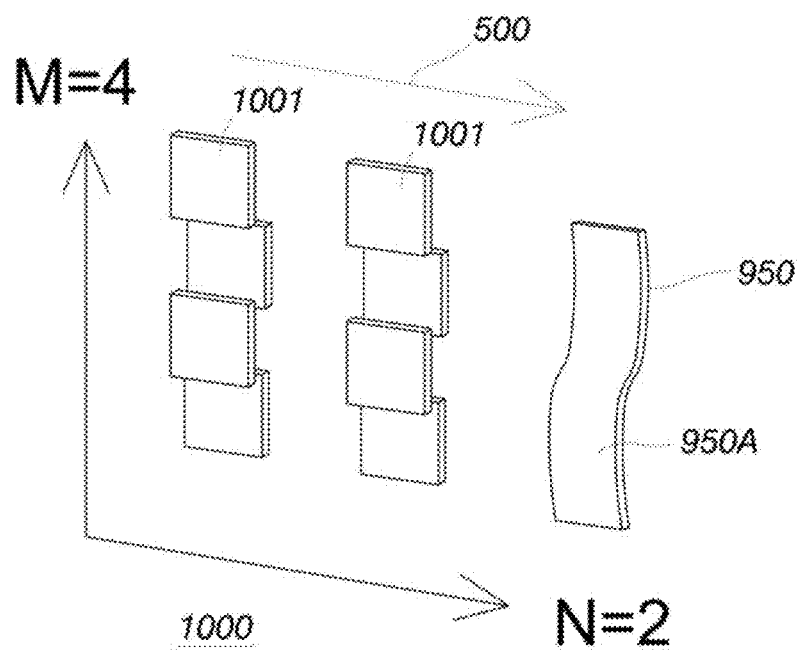
FIG. 10 is a diagram schematically illustrating sputtering units divided into sections according to another embodiment of the present invention.
Figure 11:
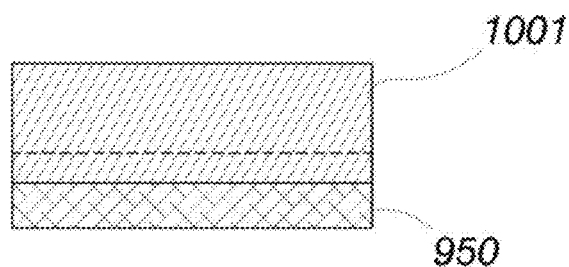
FIG. 11 is a diagram schematically illustrating a sputtered surface to be sputtered that corresponds to FIG. 10.

FIG. 10 is a diagram schematically illustrating sputtering units divided into sections according to another embodiment of the present invention. In an example of FIG. 10, a sputtering array 1000 is a sputtering array with two columns and four rows (i.e., N=2 and M=4). The sputtering array 1000 includes targets that increase the thickness of a single sputtered film Compared with the sputtering array 900 of FIG. 8, more materials are sputtered on the object to be sputtered to form the thicker thickness of the sputtered film. As illustrated in FIG. 11, a material 1001 with a double thickness (compared with FIG. 9) is stacked on the object 950 to be sputtered. FIG. 11 is a diagram schematically illustrating a sputtered surface to be sputtered that corresponds to FIG. 10. By the same token, if the sputtering array 1000 is a sputtering array with four columns and four rows (i.e., N=4 and M=4), the object to be sputtered is sputtered four times to form a sputtered film with a quadruple thickness.

Figure 12:
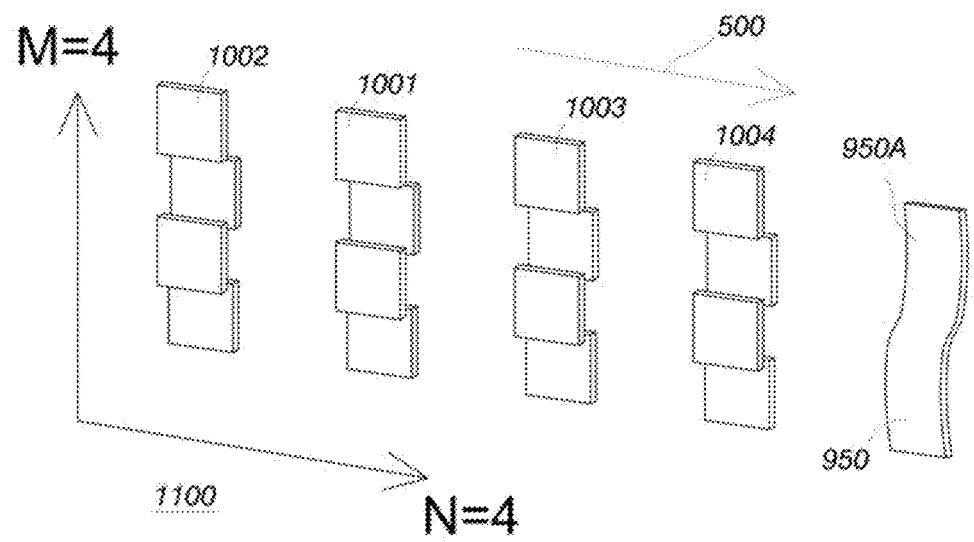
FIG. 12 is a diagram schematically illustrating sputtering units divided into sections according to further embodiment of the present invention.
Figure 13:
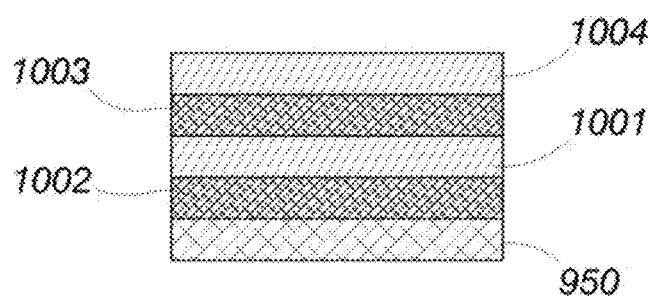
FIG. 13 is a diagram schematically illustrating a sputtered surface to be sputtered that corresponds to FIG. 12.

FIG. 12 is a diagram schematically illustrating sputtering units divided into sections according to further embodiment of the present invention. In an example of FIG. 12, a sputtering array 1100 is a sputtering array with four columns and four rows (i.e., N=4 and M=4). The sputtering array 1100 includes targets that form multiple sputtered films (e.g., a combination of SiO$_2$ and Nb$_2$O$_5$). For example, the object to be sputtered is sputtered with different materials when the object to be sputtered moves along a moving direction. Thus, mixed films are sputtered. As illustrated in FIG. 13, materials 1002, 1001, 1003, and 1004 (e.g., Nb$_2$O5, SiO$_2$, Nb$_2$O$_5$, and SiO$_2$) are sequentially stacked on the object 950 to be sputtered. FIG. 13 is a diagram schematically illustrating a sputtered surface to be sputtered that corresponds to FIG. 12. To sum up, in an example of FIG. 12, each column of the sputtering units has the targets 1001 and 1004 made of the same material and every two adjacent columns of the sputtering units have the targets 1002 and 1001 made of different materials. That is to say, the materials of the sputtering units in a vertical direction are the same. The materials of the sputtering units in a horizontal direction are the same or different. In other words, according to the requirement of users, each row of the sputtering units in a horizontal direction is made of the same or different material. The sputtering units may sputter multiple films on the surface of the object to be sputtered or increase the thickness of a single film. Besides, the sputtering material is uniformly sputtered on the surface of the object to be sputtered. Thus, each column of the sputtering units in a vertical direction is made of the same material.

Figure 14A:
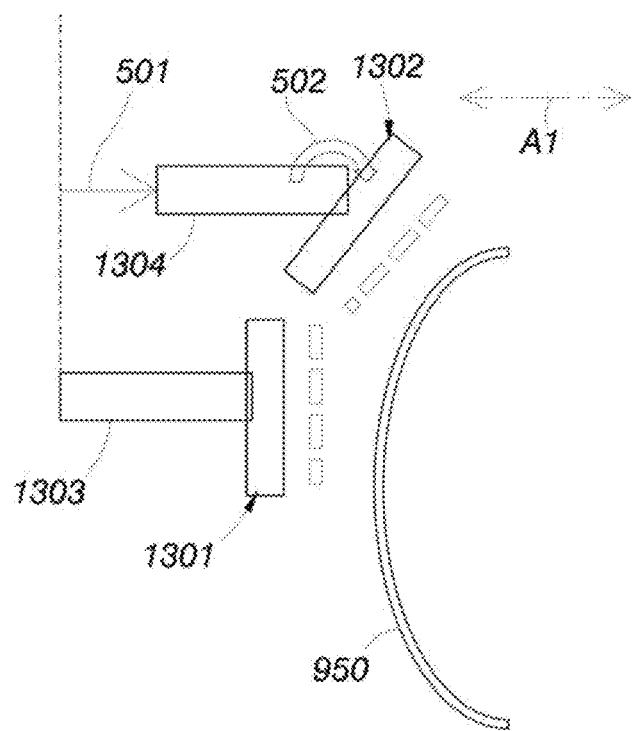
FIG. 14A is a diagram schematically illustrating the target of a sputtering unit controlled to rotate based on the curvature of a curved surface according to an embodiment of the present invention.

FIG. 14A is a diagram schematically illustrating the target of a sputtering unit controlled to rotate based on the curvature of a curved surface according to an embodiment of the present invention. As illustrated in FIG. 14A, a target 1301 is very close to a three-dimensional surface faced by the target 1301. Thus, the target 1301 does not rotate or slight rotates by a driving shaft 1303. However, the three-dimensional surface faced by a target 1302 is a curved surface with a large curvature. Accordingly, the target 1302 rotates a larger angle relative to the direction A1 of a projection height (e.g., a moving direction 502). In addition, a driving shaft 1304 drives the target 1302 to horizontally move towards the object 950 to be sputtered (e.g., a moving direction 501). In other words, since the three-dimensional surface has sections. The sections are respectively curved surfaces with different curvatures. The sputtering surfaces of all the sputtering units may be adjusted to have different elevation angles. The elevation angle of each sputtering unit may depend on the tangent direction of the corresponding curved surface of the curved surfaces or a connecting line between two end points of the corresponding curved surface (e.g., rotating the target such that the target surface is arranged in parallel to the connecting line between the two end points). If the sputtering rate has a little error after rotating the target, the size of the opening of the mask will be further adjusted to change the sputtering rate (as illustrated in FIG. 7B).

Figure 14B:
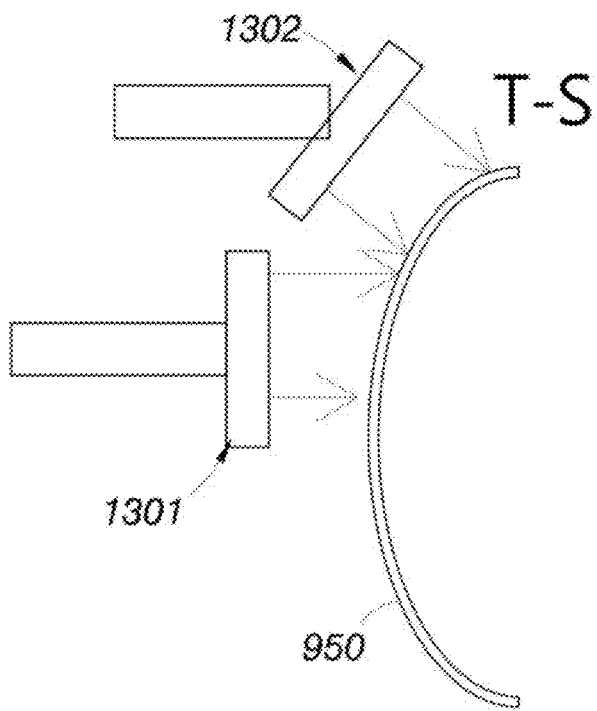
FIG. 14B is a diagram schematically illustrating the state of the target of FIG. 14A after rotation.

FIG. 14B is a diagram schematically illustrating the state of the target of FIG. 14A after rotation. The shortest distance between the left end of a target 1301 and a three-dimensional surface is equal or similar to the shortest distance between the left end of a target 1302 and the object 950 to be sputtered. The shortest distance between the right end of the target 1301 and the object 950 to be sputtered is equal or similar to the shortest distance between the right end of a target 1302 and the object 950 to be sputtered. That is to say, the average distance between the target 1301 and the corresponding section of the object 950 to be sputtered is equal or similar to the average distance between the target 1302 and the corresponding section of the object 950 to be sputtered.

Figure 15:
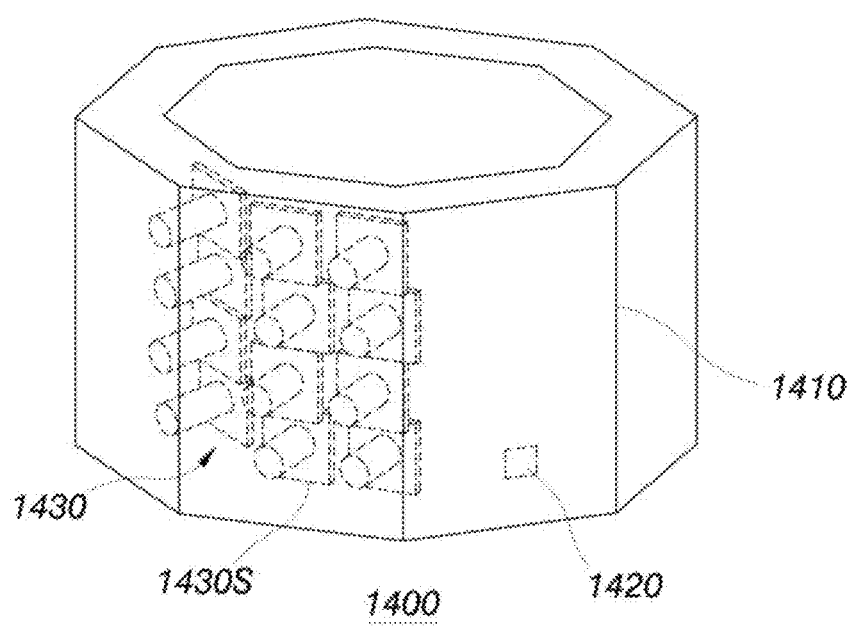
FIG. 15A is a diagram schematically illustrating a sputtering system according to another embodiment of the invention.
FIG. 15B is a top view of the sputtering system of FIG. 15A.
Figure 15:
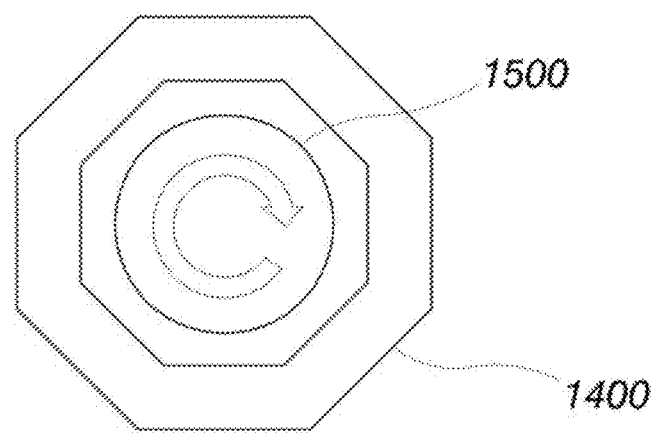

Referring to FIGS. 15A~15B, FIG. 15A is a diagram schematically illustrating a sputtering system 1400 according to another embodiment of the invention. The sputtering system 1400 independently controls each sputtering unit to more uniformly sputter the non-uniform three-dimensional surface. FIG. 15B is a top view of the sputtering system 1400 of FIG. 15A. The sputtering system 1400 includes a chamber 1410, a controller 1420, a sputtering array 1430, and a supporting device 1500. The supporting plate may be the inner wall of the chamber 1410 or a plate attached to the inner wall of the chamber 1410.

As illustrated in FIG. 15A, the inner wall of the chamber 1410 faces to a side of the supporting device 1500. Compared with the sputtering system 700 of FIG. 7, the sputtering system 1400 utilizes a batch type process. A sputtering array 1430 is annually fixed to the supporting plate in the chamber 1410. The sputtering array 1430 includes sputtering units 1430S. The sputtering array 1430 is electrically connected to the controller 1420. The controller 1420 independently controls the distance of each sputtering unit to the surface of the object to be sputtered to satisfy the given condition based on the curvature variation of the three-dimensional surface of the object to be sputtered. According to an embodiment of the present invention, the given condition defines that the shortest distance between each sputtering unit and the surface of the object to be sputtered is substantially equal. The terms "substantially equal" can refer to the meaning of the phrases of "exactly equal" or "within few errors of a value or a range". For example, the distances of different targets to the object to be sputtered have an error of 0~10 cm. Each sputtering unit of the sputtering array is independently controlled to have the shortest distance to the three-dimensional surface, wherein the shortest distance having an error within a specific range is included within the scope of the present invention.

As illustrated in FIG. 15B, the object to be sputtered is arranged on a supporting device 1500 at the center of the chamber 1410. The supporting plate on the chamber 1410 surrounds the supporting device 1500. The supporting device 1500, electrically connected to the controller 1420, supports at least one object to drive the at least one object to move relative to the sputtering array 1430. Under the given condition, the sputtering array 1430 sputters the at least one object such that each sputtering unit provides the equal or similar sputtering rate. Under the same target power and air pressure, the sputtering rate decreases as the speed that the supporting device 1500 rotates increases. On the contrary, the sputtering rate increases as the speed that the supporting device 1500 rotates decreases. However, the sputtering rate of each sputtering unit is influenced by target power, ventilation, and the moving speed of the object to be sputtered.

Figure 16:
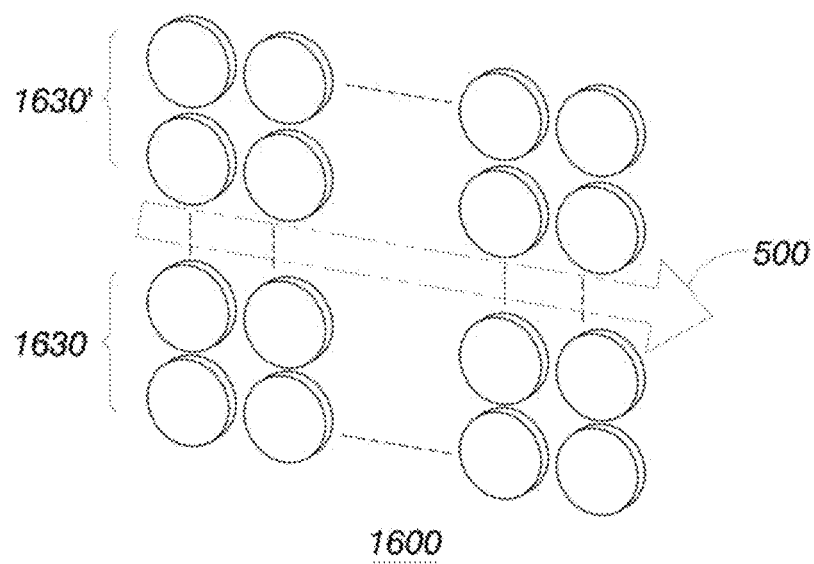
FIGS. 16-24 are diagrams schematically illustrating sputtering systems according to various embodiments of the invention.
Figure 17:
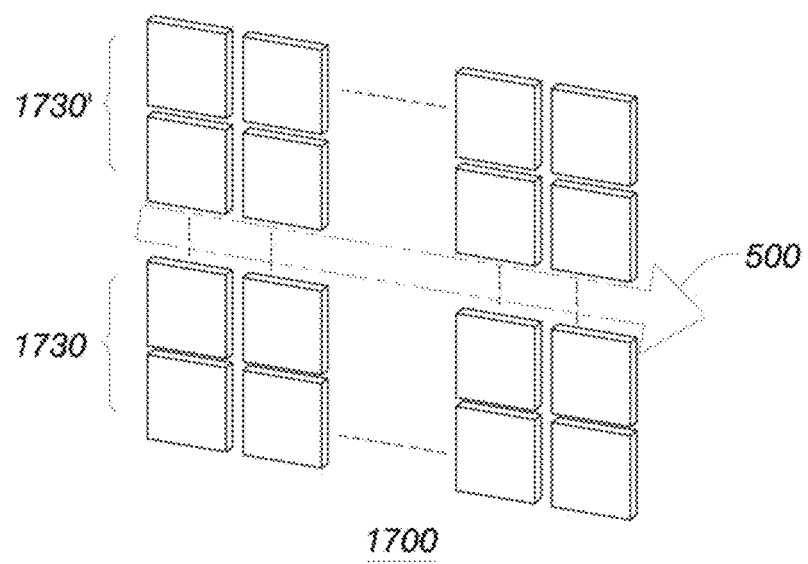
Figure 18:
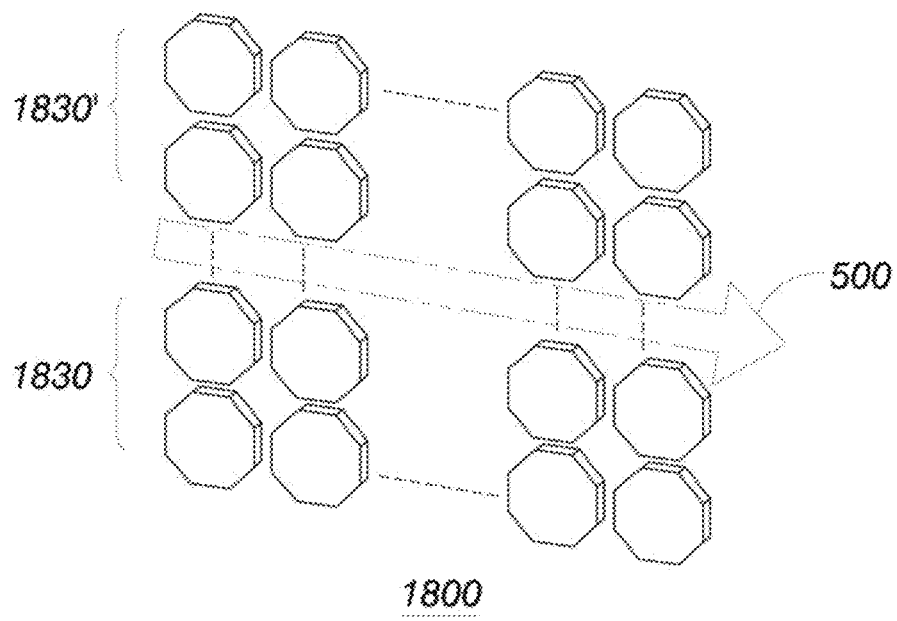

Referring to FIGS. 16~18, FIGS. 16~18 are diagrams schematically illustrating sputtering systems according to various embodiments of the invention. In these embodiments, the sputtering units respectively include planar targets with various shapes. As illustrated in FIG. 16, a sputtering system 1600 includes planar targets each having a shape of a circle. The moving direction 500 is a direction where the object to be sputtered moves. Sputtering arrays 1630 and 1630' are respectively arranged at two sides of the path where the object to be sputtered moves. All columns of the sputtering units are aligned to each other in a horizontal direction parallel to the supporting plate.

As illustrated in FIG. 17, a sputtering system 1700 includes planar targets each having a shape of a square. The direction pointed by an arrow is the direction where the object to be sputtered moves. Sputtering arrays 1730 and 1730' are respectively arranged at two sides of the path where the object to be sputtered moves. The moving direction 500 is a direction where the object to be sputtered moves. All columns of the sputtering units are aligned to each other in a horizontal direction parallel to the supporting plate. In addition, the square of the embodiment includes a rectangular.

As illustrated in FIG. 18, a sputtering system 1800 includes planar targets each having a shape of a polygon. The direction pointed by an arrow is the direction where the object to be sputtered moves. Sputtering arrays 1830 and 1830' are respectively arranged at two sides of the path where the object to be sputtered moves. The moving direction 500 is a direction where the object to be sputtered moves. All columns of the sputtering units are aligned to each other in a horizontal direction parallel to the supporting plate. In addition, the polygon of the embodiment is exemplified by an octagon, which is not to limit the scope of the present invention. There is no difference in the use of the three foregoing shapes of targets. For the in-line type process of FIG. 7, the polygon-shaped target has the best space utilization. The circle-shaped target has the second best space utilization. The square-shaped target has the worst space utilization.

Figure 19:
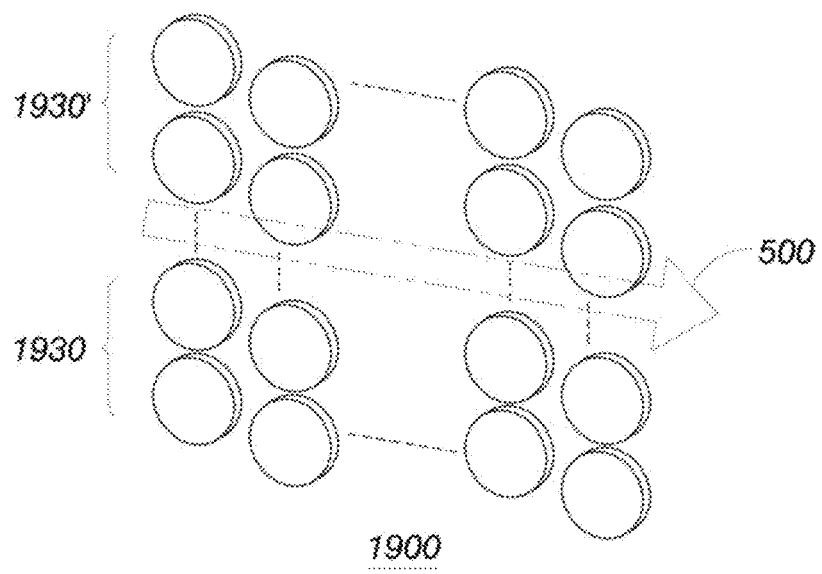
Figure 20:
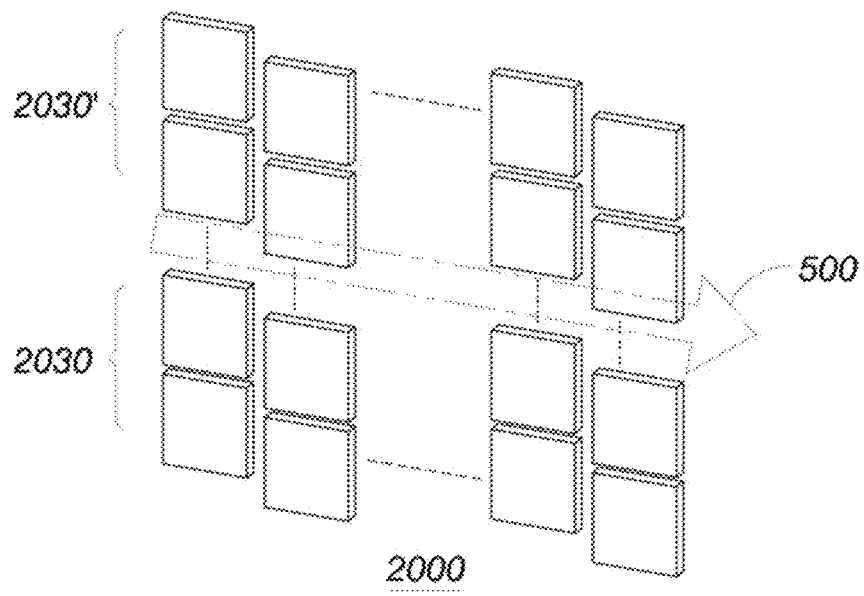
Figure 21:
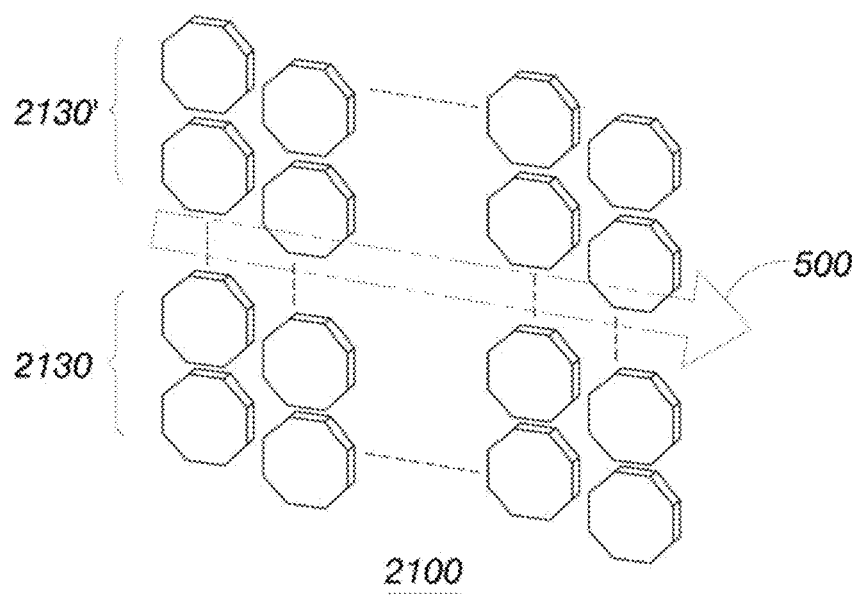

Referring to FIGS. 19~21, FIGS. 19~21 are diagrams schematically illustrating sputtering systems according to various embodiments of the invention. In these embodiments, the sputtering units respectively include planar targets with various shapes. As illustrated in FIG. 19, a sputtering system 1900 includes planar targets each having a shape of a circle. The moving direction 500 is a direction where the object to be sputtered moves. Sputtering arrays 1930 and 1930' are respectively arranged at two sides of the path where the object to be sputtered moves. Compared with FIG. 16, the sputtering units in FIG. 19 are staggered from each other. In other words, all columns of the sputtering units are staggered from each other in a horizontal direction parallel to the supporting plate.

As illustrated in FIG. 20, a sputtering system 2000 includes planar targets each having a shape of a square. The direction pointed by an arrow is the direction where the object to be sputtered moves. Sputtering arrays 2030 and 2030' are respectively arranged at two sides of the path where the object to be sputtered moves. The moving direction 500 is a direction where the object to be sputtered moves. Compared with FIG. 17, the sputtering units in FIG. 20 are staggered from each other. In other words, all columns of the sputtering units are staggered from each other in a horizontal direction parallel to the supporting plate. In addition, the square of the embodiment includes a rectangular.

As illustrated in FIG. 21, a sputtering system 2100 includes planar targets each having a shape of a polygon. The direction pointed by an arrow is the direction where the object to be sputtered moves. Sputtering arrays 2130 and 2130' are respectively arranged at two sides of the path where the object to be sputtered moves. The moving direction 500 is a direction where the object to be sputtered moves. Compared with FIG. 18, the sputtering units in FIG. 21 are staggered from each other. In other words, all columns of the sputtering units are staggered from each other in a horizontal direction parallel to the supporting plate. There is no difference in the use of the three foregoing shapes of targets. For the in-line type process of FIG. 7, the polygon-shaped target has the best space utilization. The circle-shaped target has the second best space utilization. The square-shaped target has the worst space utilization.

Figure 22:
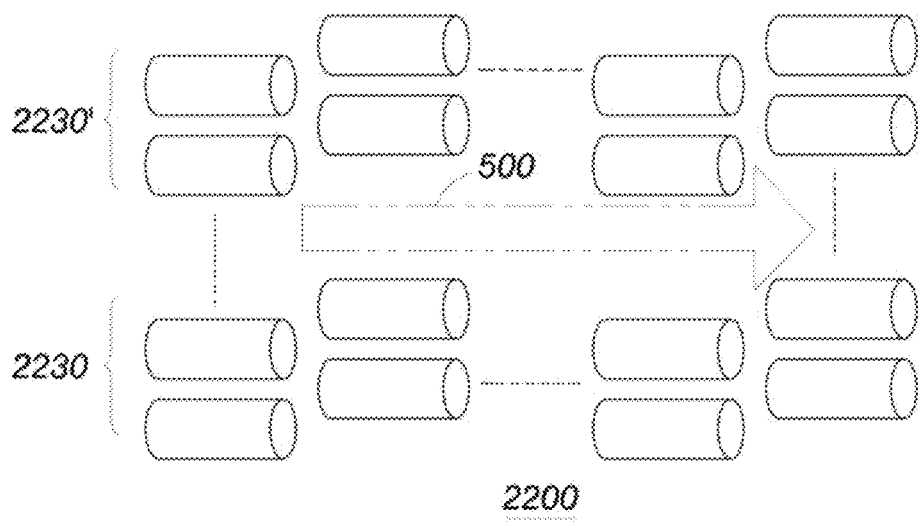

Referring to FIG. 22, FIG. 22 is a diagram schematically illustrating a sputtering system 2200 according to an embodiment of the invention. The sputtering units in FIG. 22 are pillar-shaped sputtering units. The target of each of the sputtering units has a shape of a pillar. The sputtering units are arranged and extended in a horizontal direction parallel to the supporting plate. Sputtering arrays 2230 and 2230' are respectively arranged at two sides of the path where the object to be sputtered moves. The moving direction 500 is a direction where the object to be sputtered moves. It is noted that the pillar is exemplified by a cylinder in FIG. 22, but the present invention is not limited thereto. Compared with the planar target, the cylinder-shaped target has high material utilization. However, the cylinder-shaped target needs a rotatable target substrate. Thus, the cylinder-shaped target requires a larger space in a vertical direction. Based on these differences, the cylinder-shaped target is used for an object with a surface thereof having a slightly-varying curvature. The planar target is used for an object with a surface thereof having a greatly-varying curvature. The sputtering surfaces of the planar targets have elevation angles corresponding to all the curved sections. In the embodiment, all columns of the sputtering units are staggered from each other in a horizontal direction parallel to the supporting plate. In other variations, all columns of the sputtering units are aligned to each other in a horizontal direction parallel to the supporting plate, as illustrated in FIGS. 16~18.

Figure 23:
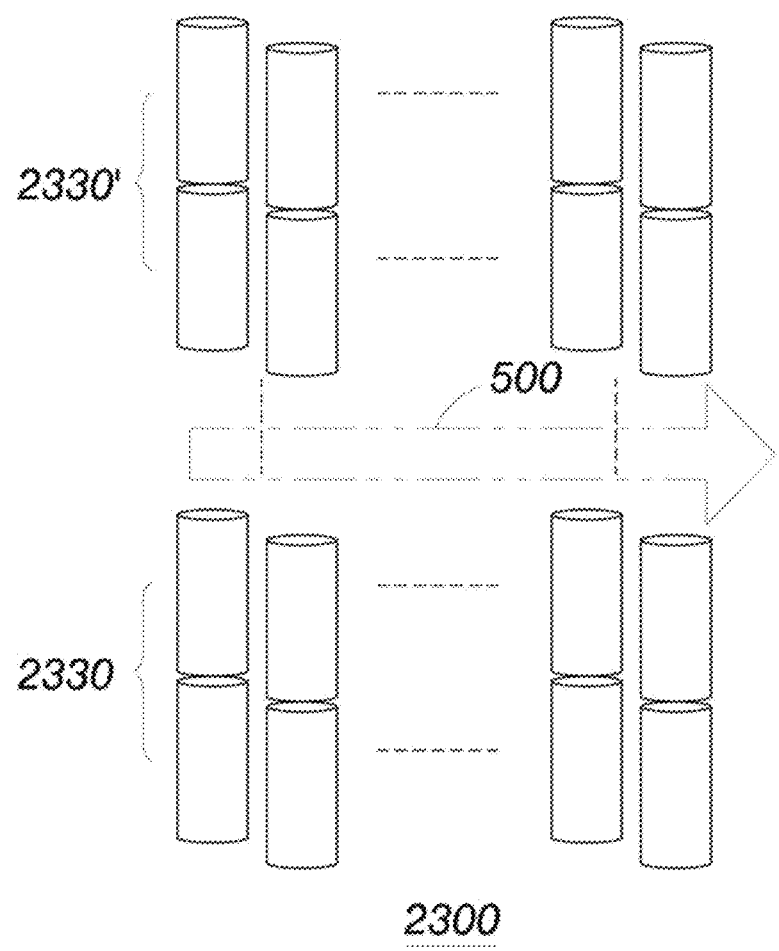
Figure 24:
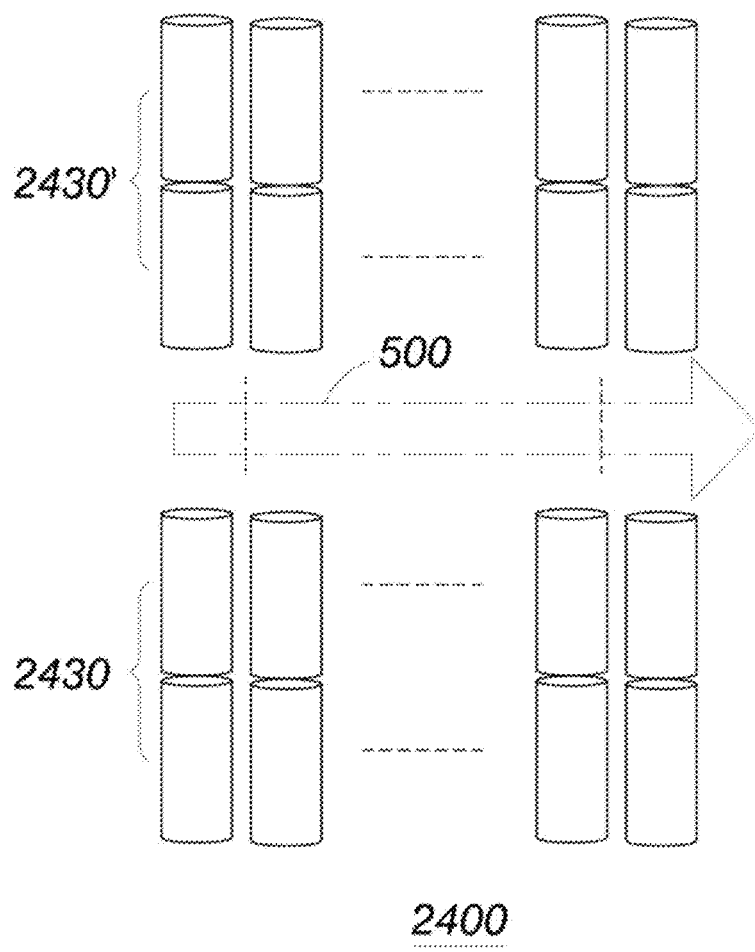

Referring to FIGS. 23~24, FIGS. 23~24 are diagrams schematically illustrating sputtering systems including pillar-shaped targets according to various embodiments of the invention. The moving direction 500 is a direction where the object to be sputtered moves. Compared with the sputtering arrays 2230 and 2230' in FIG. 22, the sputtering units of sputtering arrays 2330 and 2330' are extended and arranged in a horizontal direction perpendicular to the supporting plate. In addition, all columns of the sputtering units of sputtering units 2430 and 2430' in FIG. 24 are staggered from each other in a horizontal direction parallel to the supporting plate.

In conclusion, the sputtering units of the present invention may be implemented with planar targets or pillar-shaped targets. The planar targets may be made of ceramic material, alloy, or single metal. The rotational target may be made of composite material or single metal, as shown in the following table.

| | | |
|---|---|---|
| Planar target | Ceramic material | ITO/AZO/HAZO/GZO/ i-ZnO/ATO/IZO/IGZO $Nb_2Ox/TiOx/SiO_2/CdS/Al_2O_3/SnO_2/Zr$ $O_2/MgF_2/MgO/ZnS/ZnMgO$ |
| | Alloy | Al-alloy/AlCu/AlTi/CuGa/CuIn/CuIn Ga/CuNi/CuZn/NiCr/NiV/NiCu/ZnSn/ ZnAl/Mo-alloy/Ti-alloy/Cr-alloy/ SiAl/SiZr/InSn |
| | Single metal | Si/Al/C/Mo/In/Ti/Nb/Zn/ Cu/Sn/Ni/Ag/Ta/C |
| Rotational target | Composite material | $AZO/i\text{-}ZnO/Nb_2Ox/TiOx/SiAl/$ SiZr/ZnSn/ZnAl/TiAl/CuNi/NiCr |
| | Single metal | Si/Cr/Al/Mo/Nb/Sn/Cu/Ti/Ag/C |

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A sputtering system configured to sputter a surface to be sputtered, the surface to be sputtered having sections, each of the sections having a projection height, and the sputtering system comprising:
    a supporting plate;
    a sputtering array, arranged on the supporting plate, comprising sputtering units, wherein each of the sections corresponds to at least one of the sputtering units, each of the sputtering units has a driving shaft and a target, a first end of each of the driving shafts is connected to the supporting plate, a second end of each of the driving shafts is connected to each of the targets, and the target faces the surface to be sputtered;
    a controller electrically connected to the driving shafts, wherein the driving shafts are configured to drive the targets to move relative to the surface to be sputtered, and the controller is configured to control a distance between each of the sputtering units and a corresponding section of the sections in a direction of the projection height to satisfy a given condition; and
    at least one chamber and a supporting device, the at least one chamber accommodates the supporting plate, the sputtering array, and the controller and surrounds the supporting device, the supporting device supports an object having the surface to be sputtered, and the supporting device drives the object having the surface to be sputtered to rotate about an axis perpendicular to a normal of the supporting plate, and the sputtering array is configured to sputter the surface to be sputtered that is driven by the supporting device to rotate;
    wherein, each of the sputtering units comprises a mask arranged between the target of each of the sputtering units and a corresponding section of the sections;
    wherein the sections are respectively curved surfaces and the projection height is a height of a highest point of the curved surface or an average height of all points of the curved surface;
    wherein the targets of the sputtering units have unequal lengths whose directions are perpendicular to a direction of the projection height.

2. The sputtering system according to claim 1, wherein the sputtering array is an array with N columns and M rows, M is a positive integer larger than or equal to 2, and N is a natural number.

3. The sputtering system according to claim 2, wherein each column of the sputtering units has the targets made of a same material and every two adjacent columns of the sputtering units have the targets made of different materials.

4. The sputtering system according to claim 2, wherein the sputtering units are pillar-shaped sputtering units, the target of each of the sputtering units has a shape of a pillar, and all columns of the sputtering units are staggered from each other in a horizontal direction parallel to the supporting plate.

5. The sputtering system according to claim 2, wherein the target of each of the sputtering units has a planar shape and all columns of the sputtering units are aligned to each other in a horizontal direction parallel to the supporting plate.

6. The sputtering system according to claim 2, wherein the target of each of the sputtering units has a planar shape and all columns of the sputtering units are staggered from each other in a horizontal direction parallel to the supporting plate.

7. The sputtering system according to claim 1, wherein the length of each of the targets depends on a curvature of a corresponding curved surface of the curved surfaces.

8. The sputtering system according to claim 1, wherein the target of each of the sputtering units has a shape of a pillar and the sputtering units are arranged and extended in a horizontal direction parallel to the supporting plate.

9. The sputtering system according to claim 1, wherein the target of each of the sputtering units has a shape of a pillar and the sputtering units are arranged and extended in a direction perpendicular to the supporting plate.

10. The sputtering system according to claim 1, wherein each of the masks comprises movable sub-masks and a sputtering rate of the sputtering array depends on a horizontal movement of the sub-masks.

11. The sputtering system according to claim 1, wherein each of the masks comprises openings and a sputtering rate of the sputtering array depends on sizes of the openings.

* * * * *